(12) United States Patent
Atkinson et al.

(10) Patent No.: US 9,433,090 B2
(45) Date of Patent: Aug. 30, 2016

(54) EDGE PLATED PRINTED CIRCUIT BOARD

(71) Applicant: MICROSOFT TECHNOLOGY LICENSING, LLC, Redmond, WA (US)

(72) Inventors: Peter Atkinson, Seattle, WA (US); Chee Fong, Cupertino, CA (US); Mark Casebolt, Seattle, WA (US); Ying Liang, Shenzhen (CN)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 9 days.

(21) Appl. No.: 14/224,863

(22) Filed: Mar. 25, 2014

(65) Prior Publication Data

US 2015/0282298 A1 Oct. 1, 2015

(51) Int. Cl.
*H05K 9/00* (2006.01)
*H05K 1/02* (2006.01)
*H05K 3/40* (2006.01)

(52) U.S. Cl.
CPC .......... *H05K 1/0298* (2013.01); *H05K 1/0216* (2013.01); *H05K 1/0218* (2013.01); *H05K 9/0015* (2013.01); *H05K 1/0215* (2013.01); *H05K 3/403* (2013.01); *H05K 2201/09354* (2013.01)

(58) Field of Classification Search
CPC . H05K 9/0015; H05K 1/0215; H05K 1/0216
USPC .................................................. 174/382, 384
See application file for complete search history.

(56) References Cited

U.S. PATENT DOCUMENTS

| | | | |
|---|---|---|---|
| 4,758,922 A | 7/1988 | Ishigaki et al. | |
| 5,205,751 A * | 4/1993 | Schwartz | H01Q 1/242 174/359 |
| 5,250,751 A * | 10/1993 | Yamaguchi | H05K 9/0016 174/354 |
| 5,586,011 A | 12/1996 | Alexander | |
| 6,366,472 B2 | 4/2002 | Alina et al. | |

(Continued)

FOREIGN PATENT DOCUMENTS

DE 102009025647 B3 7/2010

OTHER PUBLICATIONS

"International Search Report and Written Opinion Issued in PCT Patent Application No. PCT/US2015/021365", Mailed Date: Jun. 15, 2015, (12 Pages total).

(Continued)

*Primary Examiner* — Hung V Ngo
(74) *Attorney, Agent, or Firm* — Gregg Wisdom; Judy Yee; Micky Minhas

(57) ABSTRACT

An edge plated printed circuit board (PCB) improves radiated emission performance by enhancing ground shielding on the PCB and improving the physical and electrical connection between the PCB and external EMI suppression components including an EMI chassis and gaskets. Inner ground layers within a multi-layer PCB are configured to physically extend to an edge of the PCB, which is plated using copper electroplating, so that copper ground strips disposed at the top and bottom surfaces of the PCB and the inner ground layers are all electrically coupled to the plated edge. In some embodiments, the ground strips can be made thinner compared to conventional arrangements, or be eliminated altogether as a result of the direct connection between the edge plated PCB and external EMI shields.

8 Claims, 8 Drawing Sheets

(56) References Cited

U.S. PATENT DOCUMENTS

| | | | |
|---|---|---|---|
| 6,608,251 B1 * | 8/2003 | Nurmi | H05K 9/0016 174/367 |
| 7,214,889 B2 | 5/2007 | Mazurkiewicz | |
| 7,443,693 B2 | 10/2008 | Arnold et al. | |
| 7,667,985 B1 | 2/2010 | Tamarkin et al. | |
| 7,746,657 B2 | 6/2010 | Oprea et al. | |
| 8,232,478 B2 | 7/2012 | Kim et al. | |
| 8,258,408 B2 | 9/2012 | Kim et al. | |
| 2006/0055006 A1 | 3/2006 | Orth et al. | |
| 2008/0210462 A1 | 9/2008 | Kawagishi et al. | |
| 2013/0223041 A1 | 8/2013 | Arnold et al. | |

OTHER PUBLICATIONS

Kasturi, Vijay, "The Influence of Printed Circuit Board Design on TEM Cell Measurements", In thesis Presented to the Faculty of the Graduate School of the University of Missouri-Rolla, Sep. 30, 2013, (120 pages total).

* cited by examiner

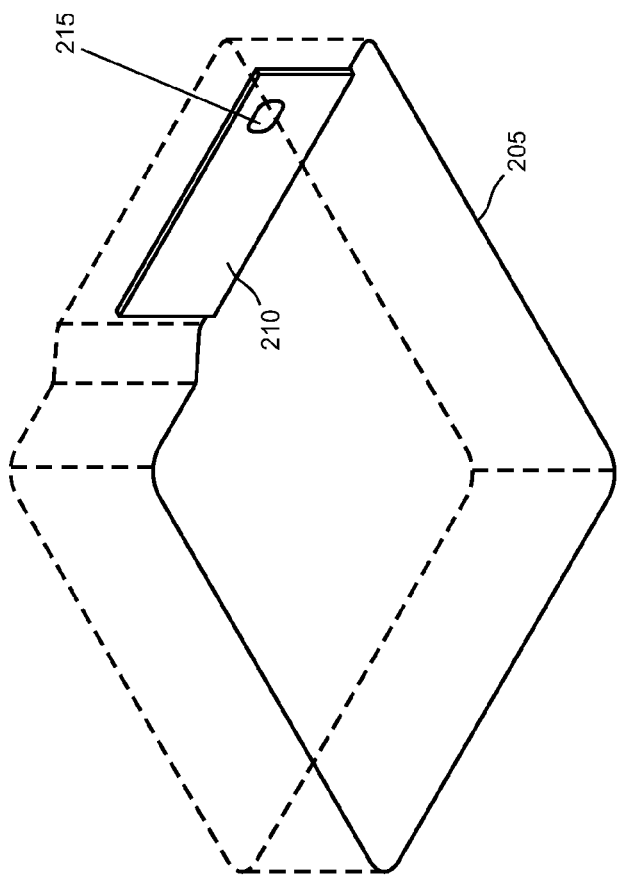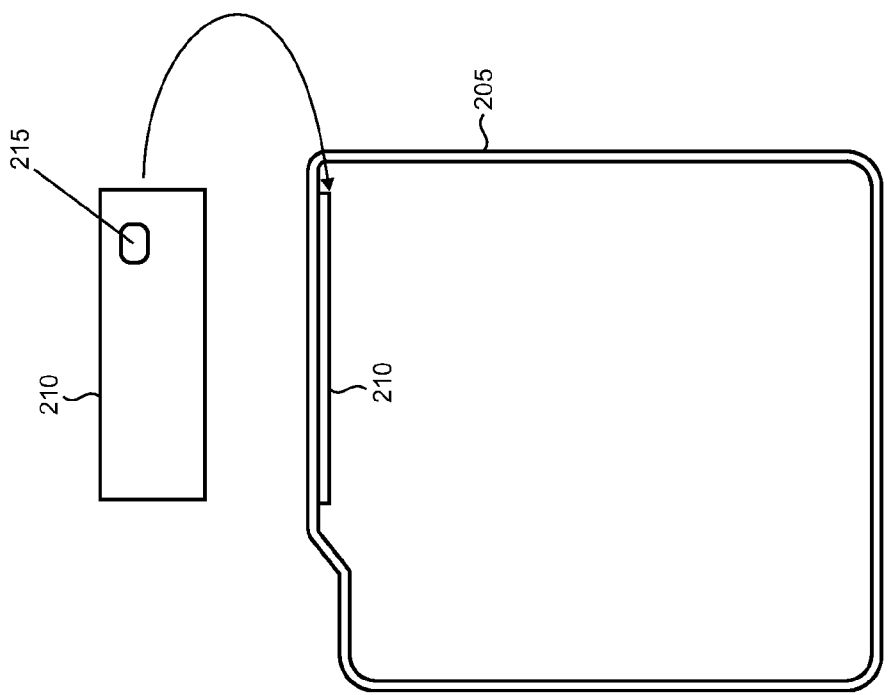

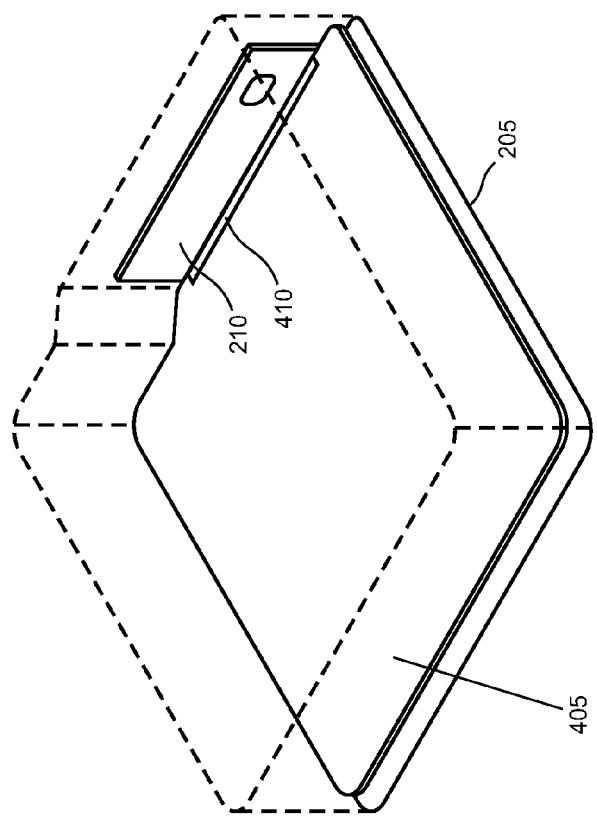
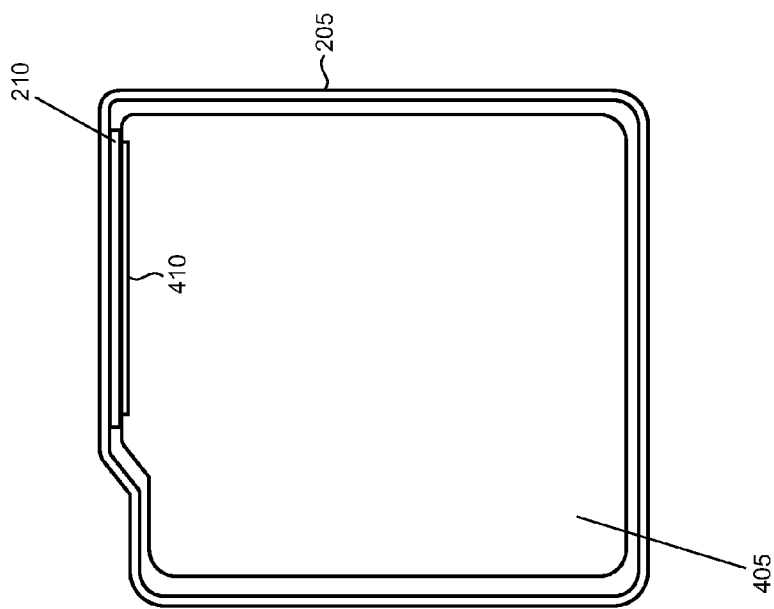

EDGE PLATED PRINTED CIRCUIT BOARD

BACKGROUND

Electronic devices have components that can produce electromagnetic interference (EMI). In order for these electronic devices to be marketable and shippable to consumers, it is typically desirable that any EMI internal to the devices be contained so that it does not cause interference with surrounding electronics. Typical electronic device components, such as central processing units (CPUs), memory systems, digital video and audio systems, digital networking interfaces, and hard drives or optical drives, etc., may produce a spectrum of EMI, ranging anywhere from a few kilohertz ($10^3$ Hz) to a few gigahertz ($10^9$ Hz). This EMI may have undesirable effects on all kinds of electrical circuits surrounding the electronic device, including, for example, televisions, personal computers (PCs), radios, and the like.

This Background is provided to introduce a brief context for the Summary and Detailed Description that follow. This Background is not intended to be an aid in determining the scope of the claimed subject matter nor be viewed as limiting the claimed subject matter to implementations that solve any or all of the disadvantages or problems presented above.

SUMMARY

An edge plated printed circuit board (PCB) improves radiated emission performance by enhancing ground shielding on the PCB and improving the physical and electrical connection between the PCB and external EMI suppression components including an EMI chassis and gaskets. Inner ground layers within a multi-layer PCB are configured to physically extend to an edge of the PCB, which is plated using copper electroplating, so that copper ground strips disposed at the top and bottom surfaces of the PCB and the inner ground layers are all electrically coupled to the plated edge. In some embodiments, the ground strips can be made thinner compared to conventional arrangements, or be eliminated altogether as a result of the direct connection between the edge plated PCB and external EMI shields.

Advantageously, the edge plated PCB blocks EMI emissions from escaping out from the PCB edge from internal signal and return (i.e., ground) layers. The edge plated PCB further provides a robust connection to the EMI gasket to tie the PCB into an overall EMI management system by having substantially the entire length of the plated edge being in contact with the EMI gasket. In addition, the coupling of the inner ground layers to the plated edge of the PCB provides a continuous uninterrupted electrical connection that reduces common mode impedance, noise coupling, and the effects of radiated EMI sources.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Furthermore, the claimed subject matter is not limited to implementations that solve any or all disadvantages noted in any part of this disclosure. These and various other features will be apparent from a reading of the following Detailed Description and a review of the associated drawings.

DESCRIPTION OF THE DRAWINGS

FIG. 2 shows an illustrative EMI suppression chassis and EMI gasket;

FIG. 3 shows a phantom line view of the EMI suppression chassis with EMI gasket located inside;

FIGS. 7 and 8 respectively show top and isometric views of the edge plated PCB when assembled into the EMI suppression chassis;

Like reference numerals indicate like elements in the drawings. Elements are not drawn to scale unless otherwise indicated.

DETAILED DESCRIPTION

Figure 1:
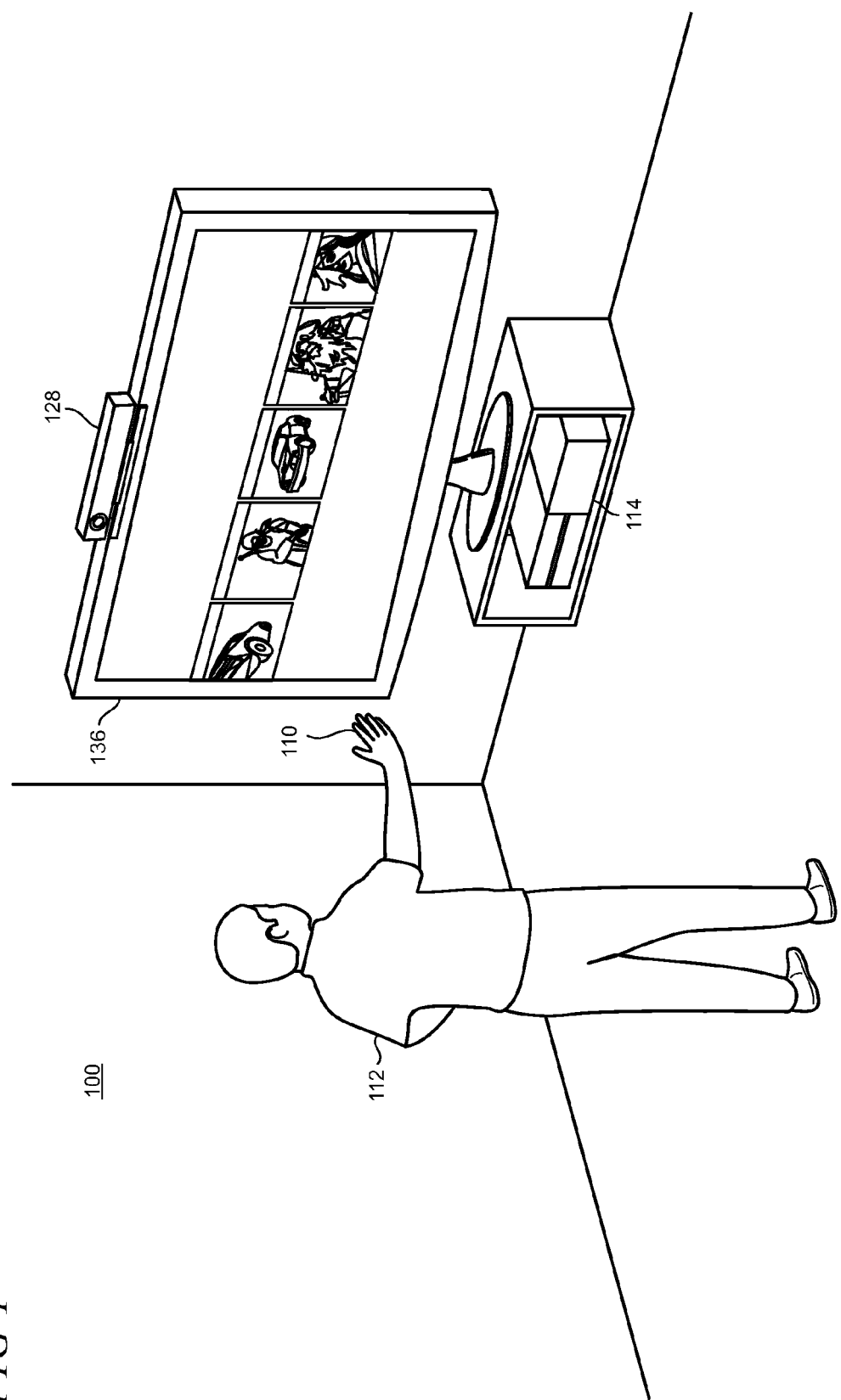
FIG. 1 shows an illustrative computing environment in which the present edge plated PCB may be implemented.

FIG. 1 shows an illustrative environment 100 in which the present edge plated PCB may be utilized. As shown, a user 112 interacts with an electronic device 114 in a typical home. In this illustrative example, the electronic device 114 is a multimedia console that is typically configured for running gaming and non-gaming applications using local and/or networked programming and content, playing pre-recorded multimedia such as optical discs including DVDs (Digital Versatile Discs) and CDs (Compact Discs), streaming multimedia (e.g., music and video) from a network, participating in social media, browsing the Internet and other networked media and content, or the like using a coupled audio/visual display such as a television 136.

The multimedia console is operatively coupled to a camera system 128 which may be implemented using one or more video cameras that are configured to visually monitor a physical space that is occupied by the user 112. The camera system 128 is configured to capture, track, and analyze the movements and/or gestures of the user 112 so that they can be used as controls that may be employed to affect, for example, an app or an operating system running on the multimedia console 114. Various motions of the hands 110 or other body parts of the user 112 may correspond to common system-wide tasks such as selecting a game or other application from a main user interface.

FIG. 2 shows a top view of an illustrative EMI suppression chassis 205 and a front view of an EMI gasket 210 that may be utilized with the present edge plated PCB to provide an overall EMI management system. The EMI suppression chassis when configured with a lid or cover (not shown) functions to surround the electrical components and circuits of the electronic device 114 or other devices such as a PC, set top box, and the like, within a grounded metal enclosure. The enclosure acts as a Faraday cage that protects the electrical components/circuits from external EMI signals and also protects the external environment from interference originating internally within the electronic device. The EMI gasket 210 is typically formed from a conductive elastomeric material and, in this illustrative example as shown in FIGS. 2 and 3, is installed along one wall of the EMI suppression chassis 205 using, for example, mechanical fasteners, conductive adhesive, or both. It is noted that the shapes of the EMI suppression chassis 205 and EMI gasket 210 shown in the drawings are intended to be illustrative and that other shapes and configurations may be utilized to meet the needs of a particular application of an edge plated PCB.

The EMI gasket 210 may include one or more openings, as representatively indicated by reference numeral 215, through which portions of various connectors employed by the electronic device may pass. The EMI suppression chassis includes corresponding openings (not shown) so that connections to external devices can be made using the connectors. For example, the connections can include various inputs and outputs such as AC power, signaling and control including HDMI (High-Definition Multimedia Interface), Optical S/PDIF (Sony/Phillips Digital Interface), Ethernet/RJ45, USB (Universal Serial Bus), proprietary connections supporting input/output (I/O) devices (and other types of devices), and the like.

Figure 5:
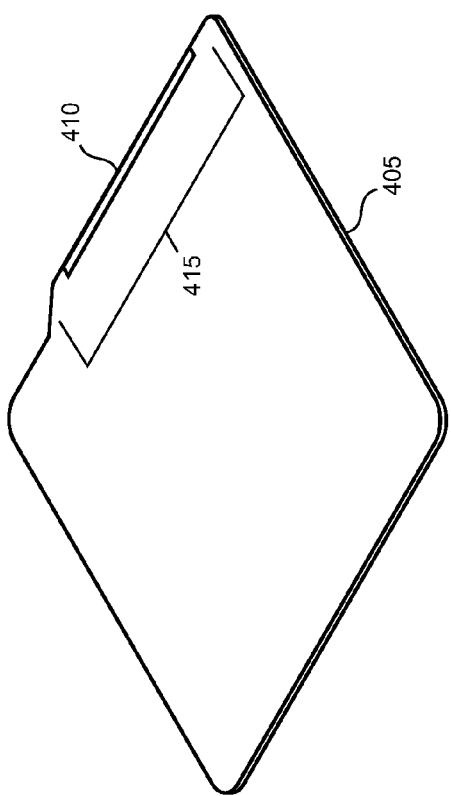
FIGS. 4 and 5 respectively show top and isometric views of an illustrative edge plated PCB.
Figure 4:
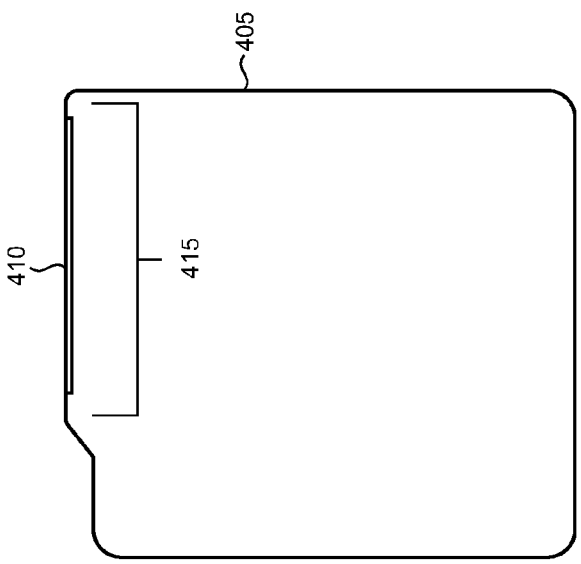
Figure 6:
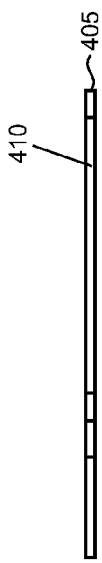
FIG. 6 shows a front (i.e., edge) view of the edge plated PCB.

FIGS. 4 and 5 respectively show top and isometric views of an illustrative edge plated PCB 405. FIG. 6 shows a front (i.e., edge) view of the edge plated PCB 405. In this particular example, the edge plating 410 utilized extends slightly over the top and bottom surfaces of the PCB 405. In alternative embodiments, the edge of the PCB board may be plated in a manner in which the plating does not significantly or substantially extend over either the top or bottom surfaces of the PCB. The PCB 405 is typically comprised of glass reinforced polymer and is configured to mechanically support and electrically connect a variety of electrical and electronic components using conductive tracks, traces, pads, and other structures (not shown in the drawings). In general, PCBs can be layered so that circuits in three dimensions can be implemented. Typically, conductive traces on various layers can be connected using plated drilled holes called vias.

In this illustrative example, as noted above, connectors are utilized to enable the electronic device 114 to be connected to external devices. The connectors (not shown) are typically located in the general area of the PCB indicated by reference numeral 415.

FIGS. 7 and 8 respectively show top and isometric views of the edged plated PCB 405 when assembled into the EMI suppression chassis 205. As shown, the edge plated PCB 405 is positioned near the bottom of the EMI suppression chassis 205 and is typically coupled to the chassis using standoffs (not shown) or similar hardware devices. The PCB 405 is also located in a manner that enables the edge plating 410 to positively contact the EMI gasket 210 substantially along the entire length of the edge plating. Such contact advantageously provides an effective path between the internal ground layers in the PCB 405 with the EMI gasket 210 to reduce shield contact impedance and enhance common ground coupling with the Faraday cage provided by the EMI suppression chassis 205.

Figure 9:
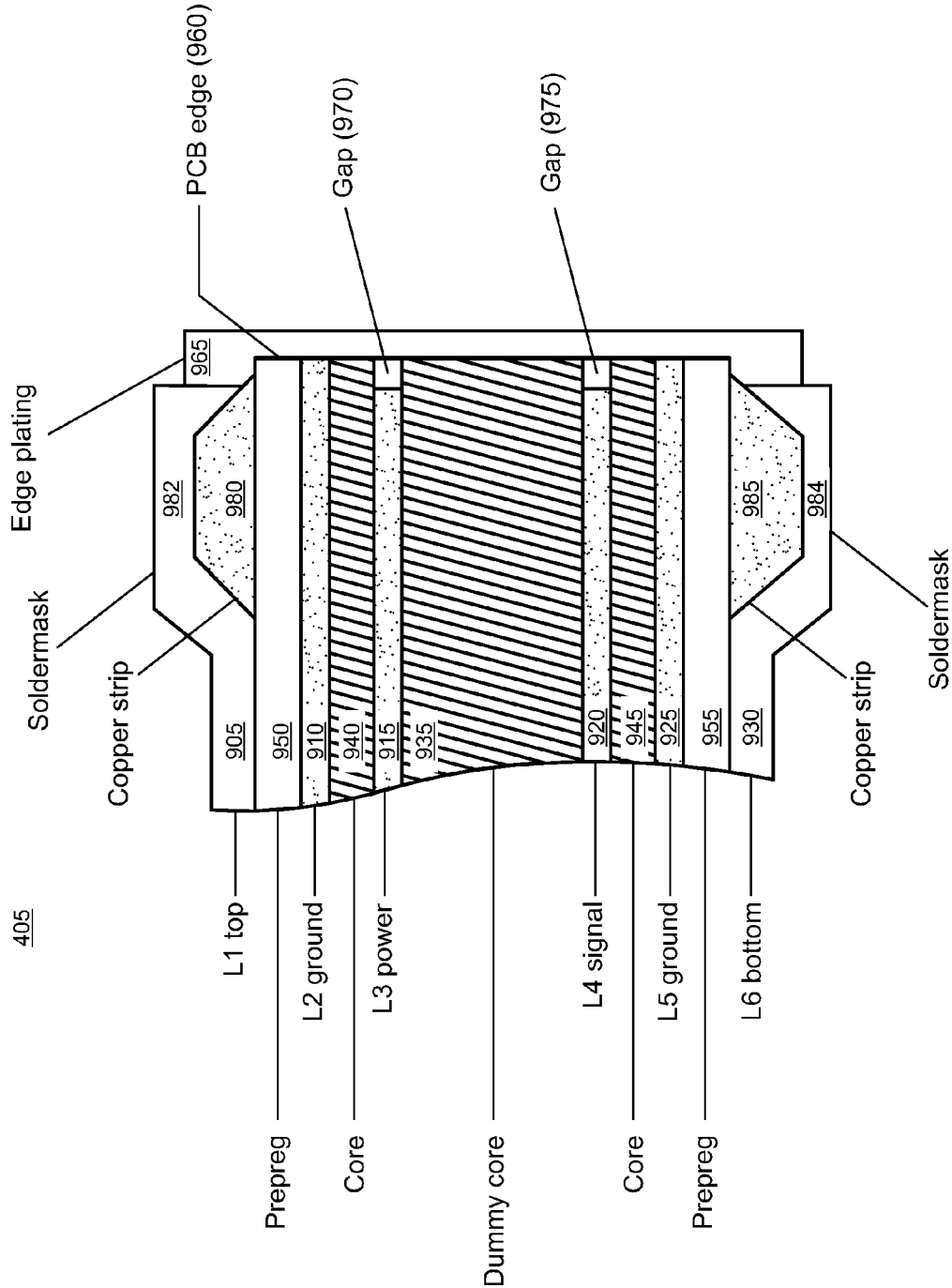
FIG. 9 shows a cross-sectional view of the edge plated PCB.

FIG. 9 shows a cross-sectional view of the edge plated PCB 405. In this particular illustrative example, the PCB 405 is arranged as a six layer board with the layers designated in the drawing as L1 through L6 using the respective reference numerals 905, 910, 915, 920, 925, and 930. However, it will be appreciated that the principles described herein may be readily applied to PCBs having more or fewer layers. The L2, L3, L4, and L5 layers, which are typically formed using copper foil, are interleaved between an inner dummy insulating (i.e., non-electrically-conducting) core 935 and insulating cores 940 and 945. Prepreg (i.e., preimpregnated) layers 950 and 955 are fiberglass/resin composites that are located towards the top and bottom of the PCB, respectively adjacent to the L1 top and L6 bottom layers 905 and 930.

As shown, the internal L2 and L5 ground layers 910 and 925 are configured to extend to the PCB's edge 960 so they are electrically coupled to the edge plating 965. By contrast, the L3 power and L4 signal layers 915 and 920 are configured so as to not extend to the PCB's edge and therefore there are gaps 970 and 975 between the L3 and L4 layers and the edge plating 965 and no electrical coupling is effectuated.

A copper strip 980 is located at the top L1 layer 905 and is covered with soldermask 982. Similarly, a copper strip 985 is located at the bottom L6 layer 930 and is covered with soldermask 984 (it will be appreciated that soldermask is typically utilized to cover all the traces on the top and bottom of the PCB 405). In this illustrative example, the copper strips 980 and 985 are also configured to be in electrical contact with the edge plating 965.

Figure 10:
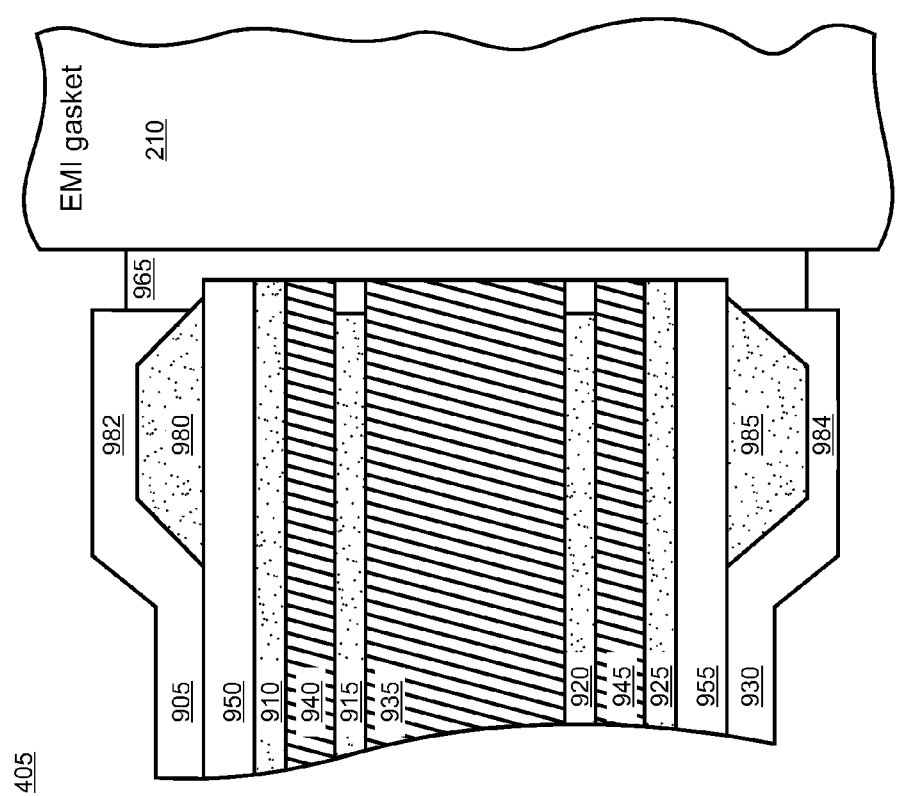
FIG. 10 shows a cross-sectional view of the edge plated PCB when assembled into the EMI suppression chassis.

FIG. 10 shows a cross-sectional view of the edge plated PCB 405 when assembled into the EMI suppression chassis so as to place the edge plating 965 in physical and electrical contact with the EMI gasket 210. Advantageously, such contact along substantially the entire length of the PCB edge enhances the coupling of the internal L2 and L5 ground layers to the EMI gasket 210 which can reduce the size of the copper strips 980 and 985 compared to conventional (i.e., non-edge plated) PCBs, or obviate their use altogether in some implementations. In addition, the enhanced coupling enabled by the edge plating can also reduce the utilization of plated vias in some cases which can advantageously reduce the number of operations during PCB fabrication. Reduced utilization of vias can also advantageously free up PCB space for other purposes and/or enables vias to be relocated away from particularly crowded areas on the board such as the connector area 415 (FIG. 4).

Figure 11:
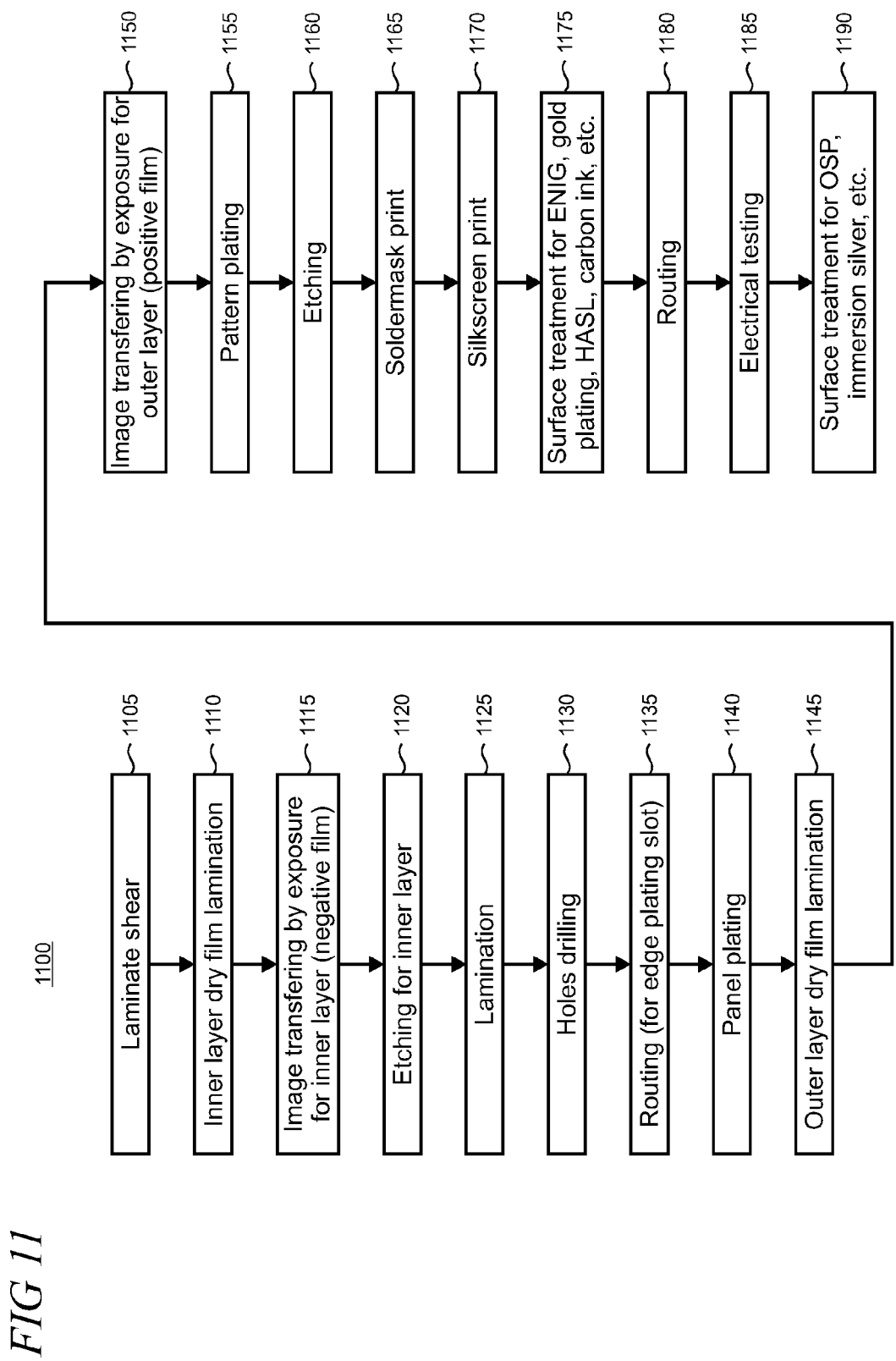
FIG. 11 is a flowchart of an illustrative method for fabricating an edge plated PCB using a modified pattern plating process.

FIG. 11 is a flowchart of an illustrative method 1100 for fabricating an edge plated PCB using a modified pattern plating process that adds an additional routing operation to create a slot which is plated that becomes the PCB's plated edge when the PCB is cut to size from a larger panel as an individual part. Unless specifically stated, the methods or steps shown in the flowchart in FIG. 11 and described below are not constrained to a particular order or sequence. In addition, some of the methods or steps thereof can occur or be performed concurrently and not all the methods or steps have to be performed in a given implementation depending on the requirements of such implementation. Some methods or steps may also be optionally utilized.

In step 1105 the raw PCB laminate material is sheared to create panels of a desired size. The number of finished PCBs per panel can vary (e.g., 2, 4, or more per panel) by implementation. In step 1110, a dry light-sensitive film or photo-imageable resist is laminated to the inner layers of the panel using heat and pressure. In step 1115, an image of the traces for a particular circuit design is exposed to the light sensitive material using a negative piece of film. The unexposed dry film is then chemically removed prior to going to the next step. In step 1120, copper material is chemically removed from the inner layer using an etching process and exposed dry film is later chemically removed.

In step 1125, the additional cores (e.g., cores 940 and 945 in FIG. 9) and copper foil layers are laminated using heat and pressure (and in some cases a bonding agent) to the inner dummy core to create the multilayer PCB. Holes for vias are drilled in step 1130. In step 1135, a slot is routed in the panel. As noted above, a portion of the slot is used as an edge of an individual PCB when it is cut from the panel. The routed slot is located in the panel so that the internal L2 and L5 ground layers come right to the edge of the slot, as described above. Accordingly, step 1135 represents a modification from a conventional pattern plating PCB fabrication process.

Figure 12:
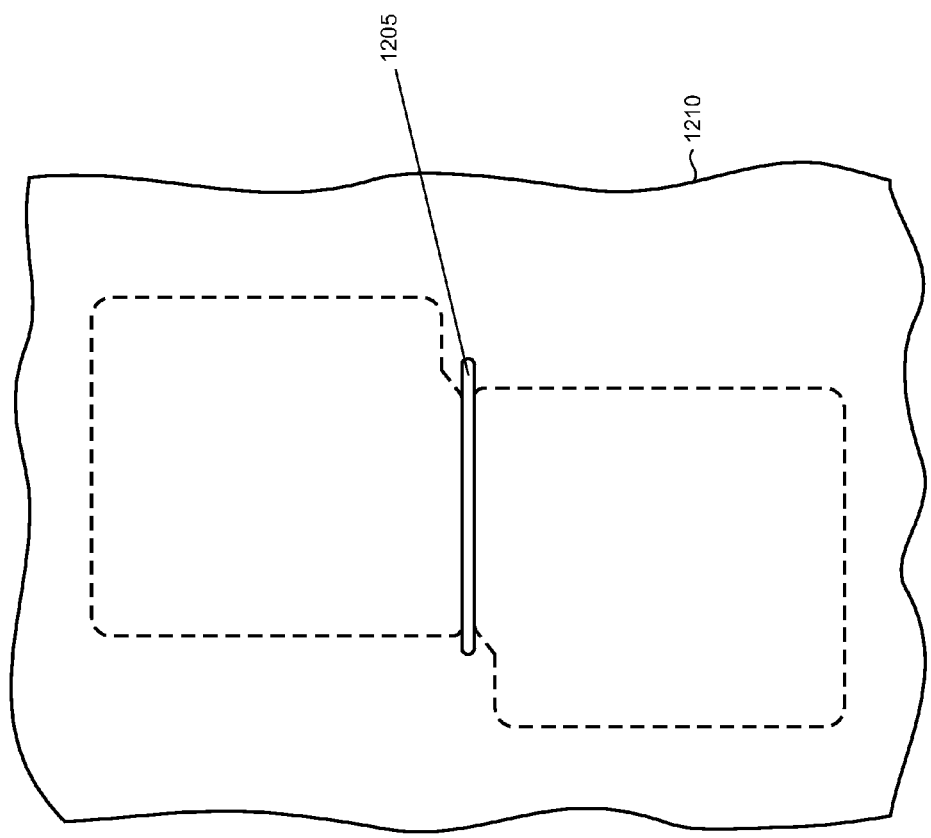
FIG. 12 shows an illustrative slot that is routed in a laminate panel that is used to implement a plated edge for one or more individual PCBs.

FIG. 12 illustrates a slot 1205 that is routed in a multilayer PCB panel 1210. The dashed lines indicate the outlines of two individual PCBs (when subsequently cut out of the panel 1210) for which the routed slot 1205 forms an edge. In this particular example, the slot is commonly shared by two PCBs but other routing configurations may also be used depending on the needs of a particular implementation.

Returning to FIG. 11, in step 1140, the panel is electroplated to deposit copper in the vias drilled during step 1130 as well as on the exposed edges of the slot 1205 (FIG. 12) that was routed in the panel in step 1135 to form the plated edge 410 (FIG. 4).

In step 1145, dry film is laminated to the panel's outer layers. In step 1150, an image of the traces/pads for a particular circuit design is exposed to the light-sensitive material using a positive piece of film and unexposed dry film is later chemically removed. In step 1155, pattern plating is utilized to first electroplate copper onto exposed copper (e.g., circuit traces/pads) surfaces, and to subsequently electroplate tin on top of the exposed copper. Exposed dry film is later removed before going to step 1160. In step 1160, an etching process is used to remove copper from areas other than the circuit traces/pads that are covered by tin. Subsequently, the tin on top of copper (circuit traces/pads) is etched away separately before going to step 1165. A soldermask print process is utilized in step 1165 in which a photo-sensitive epoxy based coating is applied and subjected to a similar process as the image transfer in step 1150 to expose areas that are going to be covered by soldermask as defined by the circuit design. Unexposed soldermask is chemically washed away prior to going to step 1170.

Various legends and nomenclature may be applied to the PCBs in the panel via a silkscreen print process in step 1170. A surface treatment (other than Organic Solderable Preservative (OSP) and Immersion Silver) is applied to the PCB panel in step 1175 including, for example, ENIG (Electroless Nickel Immersion Gold), gold plating, HASL (Hot Air Solder Leveling), and/or carbon conductive ink application.

In step 1180, individual PCBs are cut out of the panel using a routing process and electrically tested in step 1185. OSP or Immersion Silver surface treatment may be performed in step 1190 (if OSP or Immersion Silver is the only PCB surface treatment utilized).

A conventional panel plating process may also be modified to enable a slot to be routed into a panel that forms a plated edge of one or more individual PCBs. As with the pattern plating process shown in FIG. 11, the routing for the edge slot is performed after the hole-drilling step and then the entire panel is plated. It will be appreciated that for subsequent fabrication steps, the panel plating processes reverse the print and plate steps of pattern plating for the outer layers so that after plating, the panel is printed with artwork (using negative film) and then etched.

In an alternative embodiment, substantially the entire perimeter of a PCB can be edge plated to enhance immunity to radiated EMI emissions in some cases. In this case, individual PCBs are cut from the panel prior to the panel plating step 1140 in the method 1100 (FIG. 11) so that the entire edge can be plated.

The subject matter described above is provided by way of illustration only and should not be construed as limiting. Various modifications and changes may be made to the subject matter described herein without following the example embodiments and applications illustrated and described, and without departing from the true spirit and scope of the present invention, which is set forth in the following claims.

What is claimed:

1. A printed circuit board (PCB), comprising:
   a dummy core having a circuit configuration of electrically conductive material on at least one of its surfaces;
   one or more supplemental cores being layered with the dummy core so that the printed circuit board is multi-layered; and
   at least one plated edge to which one or more ground layers extend to form a continuous ground path, the ground layers being implemented using portions of one or more of the circuit configurations on the dummy core or on the one or more supplemental cores
   wherein the plated edge is adapted to interface with an electromagnetic interference (EMI) gasket so that the ground path is electrically coupled to the EMI gasket, the interface being maintained along substantially the plated edge's entire length, and
   wherein the EMI gasket is disposed in, and electrically coupled to an EMI chassis so that the ground path in the PCB is electrically coupled to the EMI chassis through the EMI gasket, and
   wherein a first of the one or more supplemental cores includes a layer of conductive material on at least one of its surfaces adapted for carrying power in the PCB,
   wherein a second of the one or more supplemental cores includes a layer of conductive material on at least one of its surfaces adapted for carrying signals in the PCB, and
   wherein each of the layers of conductive materials in each of the first and second of the one or more supplemental cores does not extend, nor is electrically coupled, to the plated edge.

2. The PCB of claim 1 in which the dummy core's conductive material comprises copper foil.

3. The PCB of claim 1 in which the one or more of the supplemental cores' conductive material comprises copper foil.

4. The PCB of claim 1 further comprising a conductive strip disposed on a top or bottom surface of the PCB proximate to the plated edge.

5. The PCB of claim 4 in which the conductive strip is electrically coupled to the plated edged.

6. The PCB of claim 5 in which the conductive strip comprises a copper strip.

7. The PCB of claim 1 in which the plated edge is continuous along substantially the PCB's entire perimeter.

8. The PCB of claim 1 in which the plated edge comprises electroplated copper.

* * * * *